(12) United States Patent
Heo

(10) Patent No.: US 10,204,834 B2
(45) Date of Patent: Feb. 12, 2019

(54) SEMICONDUCTOR DEVICE AND METHOD OF MANUFACTURING THE SAME

(71) Applicant: Samsung Electronics Co.. Ltd., Suwon-si, Gyeonggi-do (KR)

(72) Inventor: Yeon-Cheol Heo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/655,196

(22) Filed: Jul. 20, 2017

(65) Prior Publication Data

US 2018/0166344 A1   Jun. 14, 2018

(30) Foreign Application Priority Data

Dec. 9, 2016   (KR) .................. 10-2016-0167936

(51) Int. Cl.
| | |
|---|---|
| *H01L 21/8234* | (2006.01) |
| *H01L 27/092* | (2006.01) |
| *H01L 29/78* | (2006.01) |
| *H01L 29/423* | (2006.01) |
| *H01L 21/8238* | (2006.01) |
| *H01L 29/40* | (2006.01) |
| *H01L 29/10* | (2006.01) |

(52) U.S. Cl.
CPC .. *H01L 21/823487* (2013.01); *H01L 21/8234* (2013.01); *H01L 21/8238* (2013.01); *H01L 21/823807* (2013.01); *H01L 21/823814* (2013.01); *H01L 21/823828* (2013.01); *H01L 27/092* (2013.01); *H01L 29/10* (2013.01); *H01L 29/40* (2013.01); *H01L 29/423* (2013.01); *H01L 29/42356* (2013.01); *H01L 29/78* (2013.01); *H01L 29/7827* (2013.01)

(58) Field of Classification Search
CPC ..... H01L 21/823487; H01L 21/823885; H01L 29/66666; H01L 27/0928
USPC ........................................ 357/23.4
See application file for complete search history.

(56) References Cited

U.S. PATENT DOCUMENTS

| | | | | |
|---|---|---|---|---|
| 4,530,149 A | * | 7/1985 | Jastrzebski | H01L 21/28 257/E21.131 |
| 4,630,088 A | * | 12/1986 | Ogura | H01L 27/10823 257/302 |
| 5,293,053 A | * | 3/1994 | Malhi | H01L 27/0688 257/330 |
| 5,510,287 A | * | 4/1996 | Chen | H01L 27/11273 257/E21.676 |
| 6,747,305 B2 | * | 6/2004 | Forbes | G11C 8/10 257/296 |
| 9,136,363 B2 | | 9/2015 | Park et al. | |

(Continued)

*Primary Examiner* — Mark Prenty
(74) *Attorney, Agent, or Firm* — Myers Bigel, P.A.

(57) ABSTRACT

A semiconductor device includes a substrate; an n-type transistor including a first junction region positioned on the substrate, a first channel region positioned on the first junction region, a second junction region positioned on the first channel region, and a first gate stack at least partially surrounding the first channel region; and a p-type transistor including a third junction region positioned on the substrate, a second channel region positioned on the third junction region, a fourth junction region positioned on the second channel region, and a second gate stack at least partially surrounding the second channel region, in which the first channel region and the second channel region are epitaxial channel layers.

14 Claims, 13 Drawing Sheets

(56) References Cited

U.S. PATENT DOCUMENTS

| | | |
|---|---|---|
| 9,245,989 B2 | 1/2016 | Then et al. |
| 9,306,063 B2 | 4/2016 | Doyle et al. |
| 2013/0307513 A1 | 11/2013 | Then et al. |
| 2014/0291616 A1 | 10/2014 | Park et al. |
| 2015/0076596 A1 | 3/2015 | Colinge et al. |
| 2015/0091058 A1 | 4/2015 | Doyle et al. |
| 2015/0129964 A1 | 5/2015 | Baldauf et al. |
| 2015/0137067 A1 | 5/2015 | Colinge et al. |
| 2016/0240665 A1 | 8/2016 | Chen et al. |
| 2016/0268256 A1* | 9/2016 | Yang ............... H01L 27/088 |

* cited by examiner

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2016-0167936 filed in the Korean Intellectual Property Office on Dec. 9, 2016, the entire contents of which are incorporated herein by reference.

BACKGROUND

Technical Field

The present inventive concepts relate to semiconductor devices and methods of manufacturing the same.

Description of Related Art

Semiconductor devices have characteristics, such as small size, multifunctionality, and/or low manufacturing cost, thereby being used in many electronic industries. The semiconductor device may include a memory device storing data, a logic element calculation-processing data, a hybrid element, which is capable of simultaneously performing various functions, and the like.

Due to the high development of the electronic industry, semiconductor devices may be highly integrated, so that semiconductor devices becomes small or fine, and various research has been conducted in order to integrate more devices, such as a transistor, within a limited area of a substrate. In order to decrease the area of the substrate occupied by one transistor, various transistor structures having a vertical semiconductor channel installed on a substrate have been suggested.

The above information disclosed in this Background section is only for enhancement of understanding of the background of the inventive concepts and may contain information that does not constitute prior art that is already known in this country to a person of ordinary skill in the art.

SUMMARY

When a transistor having a vertical semiconductor channel is formed in order to allow higher device integration, a process of forming a junction may become more complex. The present inventive concepts provide semiconductor devices, of which process management is easier, and methods of manufacturing the same.

An example embodiment of the present inventive concepts provides a semiconductor device, including: a substrate; an n-type transistor including a first junction region positioned on the substrate, a first channel region positioned on the first junction region, a second junction region positioned on the first channel region, and a first gate stack at least partially surrounding the first channel region; and a p-type transistor including a third junction region positioned on the substrate, a second channel region positioned on the third junction region, a fourth junction region positioned on the second channel region, and a second gate stack at least partially surrounding the second channel region, in which the first channel region and the second channel region are epitaxial channel layers.

Another example embodiment of the present inventive concepts provides a method of manufacturing a semiconductor device, the method including: forming a first doping layer by implanting ions to an upper surface of a substrate; forming a first channel layer on the first doping layer by an epitaxy method; forming a second doping layer by implanting ions to an upper surface of the first channel layer; forming a first junction region, a first channel region, and a second junction region, which are sequentially positioned on the substrate, by etching the first doping layer, the first channel layer, and the second doping layer; and forming a first gate stack so as to at least partially surround the first channel region, in which the first doping layer and the second doping layer have the same conductivity type.

According to some example embodiments of the present inventive concepts, a method of fabricating a semiconductor device includes forming a first doped layer, an epitaxial channel layer, and a second doped layer sequentially stacked on a substrate; etching the second doped layer, the epitaxial channel layer, and the first doped layer to define a second junction region, a first channel region, and a first junction region, respectively; and forming a first gate stack on the first channel region between the first junction region and the second junction region responsive to the etching.

According to some example embodiments of the present inventive concepts, a method of fabricating a semiconductor device includes forming an n-type transistor on a substrate, the n-type transistor comprising a first junction region, a first channel region on the first junction region, and a second junction region on the first channel region; and forming a p-type transistor on the substrate adjacent the n-type transistor, the p-type transistor comprising a third junction region, a second channel region on the third junction region, and a fourth junction region on the second channel region. The first channel region and the second channel region are epitaxial layers.

According to example embodiments of the present inventive concepts, the lower junction region and the upper junction region are formed before the forming of the channel, so that it is possible to obtain a stable semiconductor device characteristic.

Further, the channel layer is formed by using a non-selective epitaxy process, so that it is possible to easily implement a collective process of a CMOS transistor.

DETAILED DESCRIPTION OF EMBODIMENTS

Hereinafter, transistor structures in semiconductor devices according to example embodiments of the present inventive concepts will be described with reference to FIG. 1.

Figure 1:
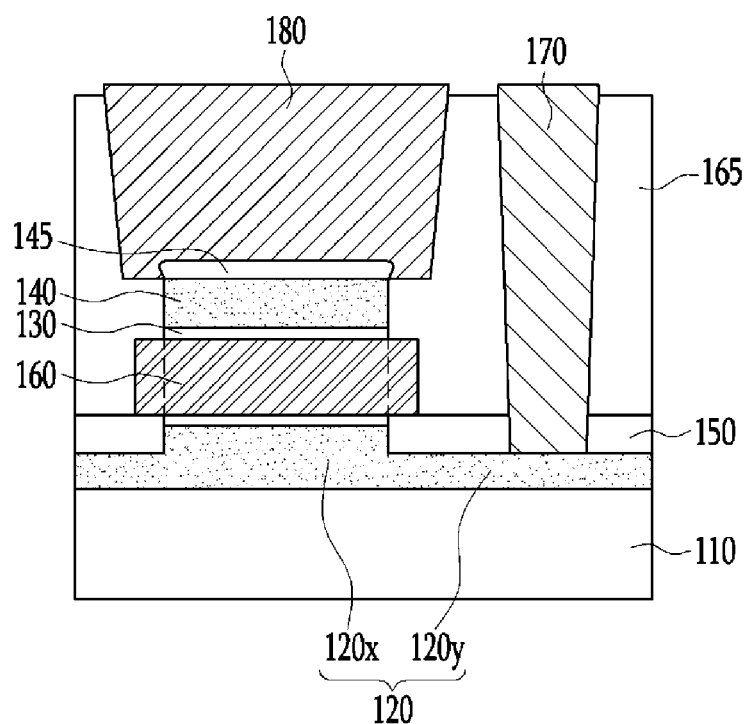
FIG. 1 is a cross-sectional view illustrating a transistor according to an example embodiment.

FIG. 1 is a cross-sectional view illustrating a transistor according to an example embodiment.

Referring to FIG. 1, a transistor according to an example embodiment includes a substrate 110, a lower junction region 120 positioned on the substrate 110, a channel region 130 positioned on the lower junction region 120, a gate stack 160 at least partially surrounding the channel region 130, and an upper junction region 140 positioned on the channel region 130.

The substrate 110 may include a semiconductor material, such as silicon, polysilicon, and germanium. In this case, the substrate 110 may be bulk silicon. Although not illustrated in FIG. 1, the substrate 110 may include a P-well region or an N-well region, or a silicon on insulator (SOI) structure.

In the lower junction region 120, n-type or p-type ions are doped in the same material as that of the substrate 110. When the lower junction region 120 is n-type, the lower junction region 120 may include a dopant, such as phosphorus (P), arsenic (As), and/or antimony (Sb), and when the lower junction region 120 is p-type, the lower junction region 120 may include boron (B) as a dopant.

The lower junction region 120 may include a first portion 120x and a second portion 120y having different thicknesses as illustrated in FIG. 1. The first portion 120x is thicker than the second portion 120y, and is a portion of the lower junction region 120 overlapping the channel region 130 and the upper junction region 140 in a vertical direction to the substrate 110. The second portion 120y is a portion, which does not overlap the channel region 130 and the upper junction region 140. As used herein, the terms first, second, third, etc. are used merely to differentiate one region, portion, or element from another.

The transistor according to the present example embodiment may further include a spacer 150 positioned on the second portion 120y of the lower junction region 120. The spacer 150 may overlap the second portion 120y, and may have a height, which is the same as or larger than that of the first portion 120x of the lower junction region 120, and may have a height, which is smaller than a height of the channel region 130. The spacer 150 may include an oxide, a silicon dioxide, a silicon nitride, and/or a silicon oxynitride. The spacer 150 may reduce or prevent an operation speed of the device from being decreased by a parasitic capacitor or parasitic capacitance.

The channel region 130 may include the same material as that of the substrate 110, and may be in a state of not being doped. The channel region 130 is formed by performing an epitaxy process. However, the channel region 130 may also include a dopant within a range in which a characteristic of the device is not influenced. For example, the range, in which a characteristic of the device is not influenced, may be a range, in which an on-off characteristic of the device is not influenced.

In the upper junction region 140, n-type or p-type ions are doped in the same material as that of the channel region 130. The dopant included in the upper junction region 140 has the same type as that of the dopant of the lower junction region 120. The upper junction region 140 may be disposed in a structure symmetric to the lower junction region 120 based on the channel region 130. In this case, a distance from the center portion of the channel region 130 to the upper junction region 140 may be substantially the same as a distance from the center portion of the channel region 130 to the lower junction region 120.

A distance between the lower junction region 120 and the upper junction region 140, that is, a thickness of the channel region 130, may be a length of the channel.

The gate stack 160 may have a shape at least partially surrounding the channel region 130 with the channel region 130 interposed therebetween. The gate stack 160 may include a gate dielectric layer and a gate conductor covering the gate dielectric layer. The gate dielectric layer may include a high dielectric material, an oxide, and/or a silicon dioxide. The gate conductor may be formed of a single conductive material, such as aluminum, copper, TiN, TaN, and TaC, or by combining the conductive materials.

A contact auxiliary layer 145 may be positioned on the upper junction region 140. The contact auxiliary layer 145 may be formed by an epitaxy process. In this case, when the epitaxy process is performed, a material is grown in a horizontal direction, as well as a vertical direction to the upper junction region 140, so that a width of the contact auxiliary layer 145 may be larger than that of the upper junction region 140. When the contact auxiliary layer 145 is formed, an area of a contact with a contact plug, which is to be described below, may be increased, thereby decreasing resistance.

A dielectric region 165 is positioned on the substrate 110, the lower junction region 120, the channel region 130, the upper junction region 140, and the spacer 150 while having a contact hole. The contact hole of the dielectric region 165 includes a lower contact plug 170, an upper contact plug 180, and a gate contact plug (not illustrated), which are in contact with the lower junction region 120, the upper junction region 140, and the gate stack 160, respectively. The contact auxiliary layer 145 is positioned between the upper junction region 140 and the upper contact plug 180, so that the upper contact plug 180 may be substantially in contact with the contact auxiliary layer 145. The lower contact plug 170, the upper contact plug 180, and the gate contact plug may be formed of a conductive material, and the gate contact plug (not illustrated) may be connected to a lateral surface of the gate stack 160. However, the present inventive concepts are not limited thereto. For example, a lateral portion of the gate stack 160 may be formed to protrude to a region, which does not overlap in the vertical direction to the upper contact plug 180 and the substrate 110, so that the gate contact plug may also be connected to an upper surface of the gate stack 160.

In the present example embodiment, the lower junction region 120 and the upper junction region 140 are formed by an ion implantation process, which will be described below, so that there are little limitations of a dopant compared to the case where the lower junction region 120 and the upper junction region 140 are formed by an epitaxy process. Particularly, in a situation where only the technology using phosphorus (P) as a dopant in order to form the junction region by the epitaxy process, has been developed, when the junction region is formed by the ion implantation like the present example embodiment, arsenic (As) and antimony (Sb) may also be used as the dopant, as well as phosphorous (P). When the relatively light phosphorous (P) is used as the dopant, the dopant may be dispersed to the channel region 130 during the heat process, but like the present example embodiment, when arsenic (As) or antimony (Sb) is used as the dopant, the aforementioned dispersion may be decreased.

Figure 2:
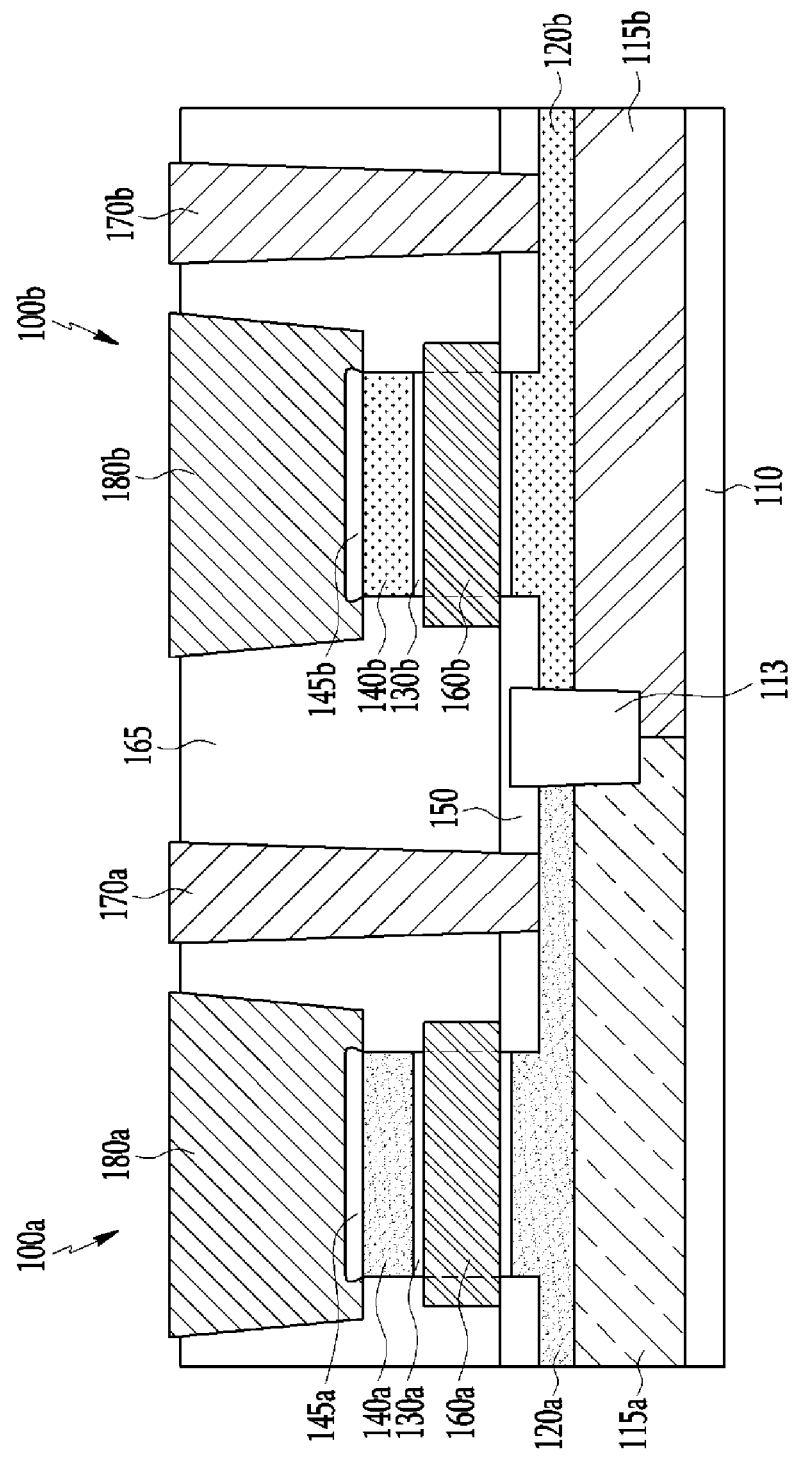
FIG. 2 is a cross-sectional view illustrating a CMOS transistor including the transistor of FIG. 1.

FIG. 2 is a cross-sectional view illustrating a CMOS transistor including the transistor of FIG. 1. Particularly, FIG. 2 represents a CMOS transistor, in which the transistor described with reference to FIG. 1 is formed of an n-type transistor and a p-type transistor.

Referring to FIG. 2, the CMOS transistor according to the present example embodiment includes an n-type transistor 100a and a p-type transistor 100b.

The n-type transistor 100a includes a P-well region 115a positioned on the substrate 110, a first junction region 120a positioned on the P-well region 115a, a first contact plug 170a contacting the first junction region 120a, a first channel region 130a positioned on the first junction region 120a, a first gate stack 160a at least partially surrounding the first channel region 130a, a second junction region 140a positioned on the first channel region 130a, a first contact auxiliary layer 145a positioned on the second junction region 140a, and a second contact plug 180a contacting the first contact auxiliary layer 145a. The first junction region 120a and the second junction region 140a may include an n-type dopant.

Although not illustrated, the CMOS transistor according to the present example embodiment may further include a gate contact plug connected with the first gate stack 160a and a gate contact plug connected with the second gate stack 160b.

The p-type transistor 100b includes an N-well region 115b positioned on the substrate 110, a third junction region 120b positioned on the N-well region 115b, a third contact plug 170b contacting the third junction region 120b, a second channel region 130b positioned on the third junction region 120b, a second gate stack 160b at least partially surrounding the second channel region 130b, a fourth junction region 140b positioned on the second channel region 130b, a second contact auxiliary layer 145b positioned on the fourth junction region 140b, and a fourth contact plug 180b contacting the second contact auxiliary layer 145b. The third junction region 120b and the fourth junction region 140b may include a p-type dopant.

A device isolating region 113 is formed in order to isolate the n-type transistor 100a and the p-type transistor 100b. The device isolating region 113 may be formed of an oxide layer, and may (for example) be formed of silicon dioxide. The device isolating region 113 may (for example) be formed by a shallow trench isolation (STI) process or a local oxidation of silicon (LOCOS) process. The device isolating region 113 may insulate the n-type transistor 100a and the p-type transistor 100b in order to reduce or prevent undesired leakage current from flowing between the n-type transistor 100a and the p-type transistor 100b.

In the present example embodiment, both the first channel region 130a and the second channel region 130b are epitaxial channel layers. The first junction region 120a may include a first portion and a second portion having a smaller thickness than that of the first portion, and the third junction region 120b may include a third portion and a fourth portion having a smaller thickness than that of the third portion.

Figure 3:
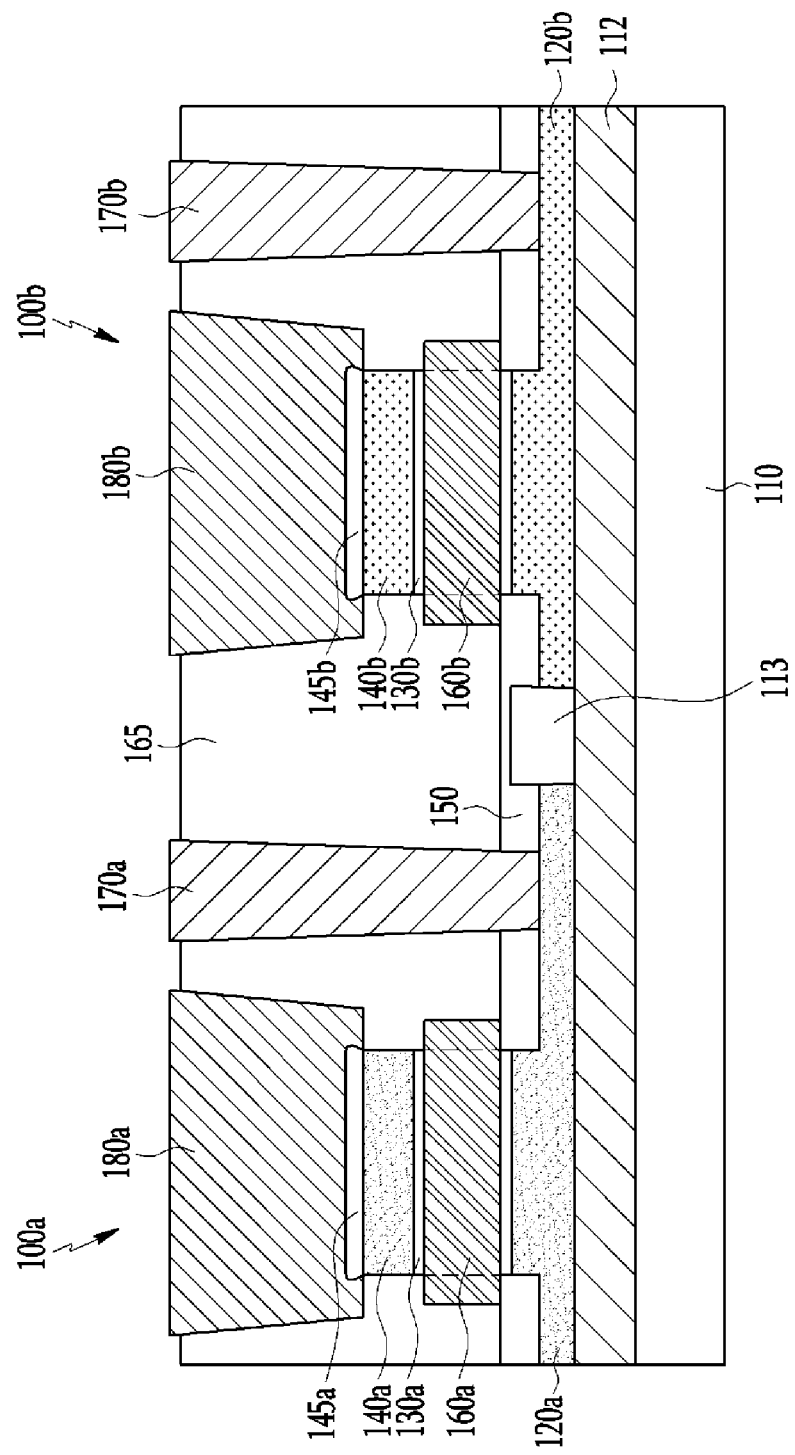
FIG. 3 is a cross-sectional view illustrating a modified CMOS transistor of the CMOS transistor of FIG. 2.

FIG. 3 is a cross-sectional view illustrating a modified CMOS transistor of the CMOS transistor of FIG. 2.

In the example embodiment of FIG. 3, the CMOS transistor is mostly the same as the CMOS transistor described with reference to FIG. 2, and different parts or elements will be described in greater detail below.

Referring to FIG. 3, the P-well region 115a and the N-well region 115b included in the CMOS transistor according to the example embodiment of FIG. 2 are not provided, and a silicon on insulator (SOI) structure is provided instead, so that an oxide layer 112 is formed on the substrate 110 in a form of a thin film. The SOI structure can be used to decrease a burden of a process forming the well region in consideration of scaling, and when the SOI structure is used, a pnpn junction structure is not made, so that it is possible to reduce or prevent a latchup phenomenon, in which a current excessively flows and is burned.

FIGS. 4 to 8 are cross-sectional views illustrating a method of manufacturing the transistor of FIG. 1.

Figure 4:
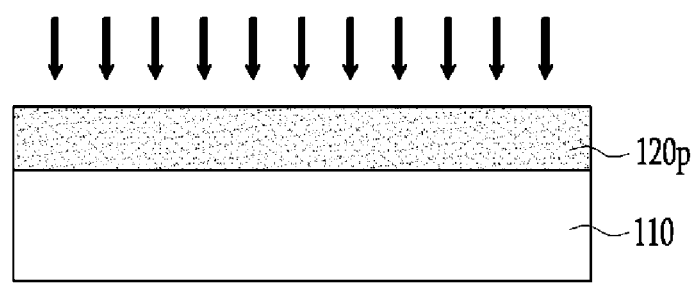
FIGS. 4 to 8 are cross-sectional views illustrating a method of manufacturing the transistor of FIG. 1.

Referring to FIG. 4, a lower doping layer 120p is formed by injecting ions to an upper surface of a substrate 110. N-type or p-type ions may be doped in the lower doping layer 120p, and when a lower junction region, which is subsequently formed, is the n-type, the lower doping layer 120p may include a dopant, such as phosphorous (P), arsenic (As), and antimony (Sb), and when the lower junction region is the p-type, the lower doping layer 120p may include boron (B) as a dopant. Doping layers as described herein may also be referred to as doped layers.

Next, an annealing process may be performed. A defect may be generated inside crystals of the substrate 110 during the ion implantation process, and the defect may be decreased through the annealing process.

Figure 5:
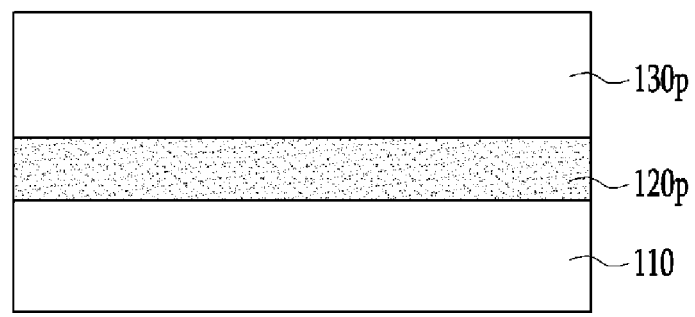

Referring to FIG. 5, a channel layer 130p is formed on the lower doping layer 120p by performing an epitaxy process with the same material as that of the substrate 110. The channel layer 130p may be in a non-doped state, but the channel layer 130p may also include a dopant within a range, in which a characteristic of a device is not influenced. A non-selective epitaxy process may be applied to the channel layer 130p, and the non-selective epitaxy process does not refer to the forming of the channel layer 130p on only a part of the upper surface of the substrate 110, but may refer to the forming of the channel layer 130p on an entire surface of the substrate 110.

Figure 6:
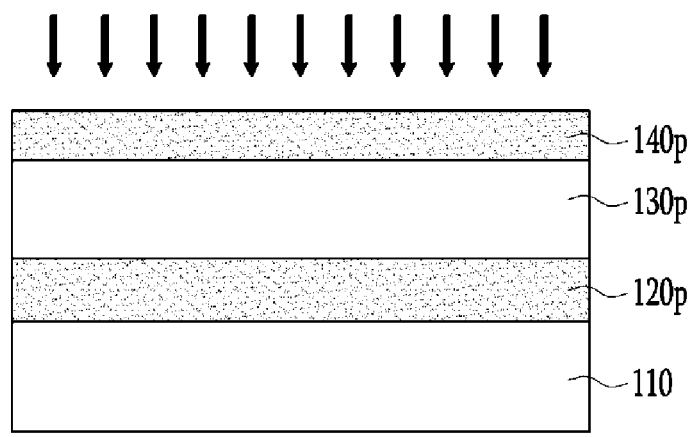

Referring to FIG. 6, an upper doping layer 140p is formed by implanting ions to an upper surface of the channel layer 130p. N-type or p-type ions may be doped in the upper doping layer 140p, and the dopant included in the upper doping layer 140p has the same type as that of the dopant of the lower doping layer 120p.

Next, the annealing process may be performed. A defect may be generated inside crystals of the channel layer 130p during the ion implantation process, and the defect may be decreased through the annealing process.

Figure 7:
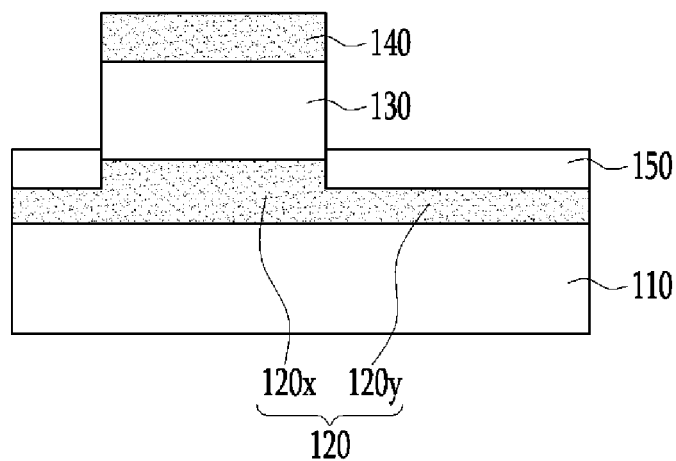

Referring to FIGS. 6 and 7, a lower junction region 120, a channel region 130, and an upper junction region 140, which are sequentially positioned on the substrate 110, are formed by etching the lower doping layer 120p, the channel layer 130p, and the upper doping layer 140p. In this case, a part of the lower doping layer 120p, which does not overlap the channel region 130, is etched, so that the lower junction region 120 may be formed to include a first portion 120x and a second portion 120y, which have different thicknesses. The first portion 120x is thicker than the second portion 120y, and is a portion overlapping the channel region 130 and the upper junction region 140.

The second portion 120y is a portion, which does not overlap the channel region 130 and the upper junction region 140.

In FIG. 7, a spacer 150 may be formed on the second portion 120y. In this case, a height of the spacer 150 may be the same as or larger than a height of the first portion 120x of the lower junction region 120, and may be smaller than a height of the channel region 130.

Figure 8:
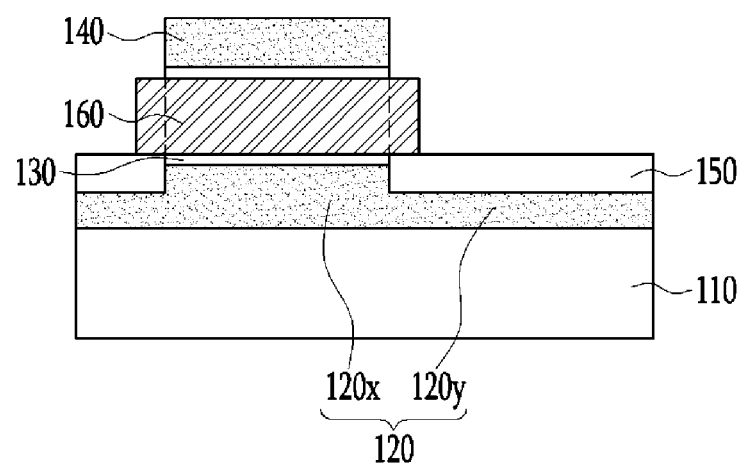

Referring to FIG. 8, a gate stack 160 is formed so as to at least partially surround the channel region 130. The gate stack 160 may include a gate dielectric film and a gate conductor on or covering the gate dielectric film. The gate dielectric layer may include a high dielectric material, an oxide, and/or a silicon dioxide. The gate conductor may be formed of a single conductive material, such as aluminum, copper, TiN, TaN, and TaC, or by combining the conductive materials.

Then, a dielectric region having contact holes, which are in contact with the lower junction region 120, the upper junction region 140, and the gate stack 160, respectively, is formed, and then, a lower contact plug 170 and an upper contact plug 180 which are illustrated in FIG. 1, and a gate contact plug (not illustrated) may be formed by filling a conductive material.

In some conventional devices, a transistor having a vertical semiconductor channel may be formed by first forming a channel and then forming a lower junction region and an upper junction region. However, in this case, the lower junction region may be formed in or by using a narrow space between previously formed channels, a gate stack may be formed, and then the upper junction region may be formed, but a depth of the junction region may depend on control of a height of the gate stack, so that a process variation may be large. Accordingly, a general process management may be difficult, so that there may be difficulty in the collective process development of the CMOS transistor. However, in the present example embodiments, the junction region is formed by using the ion implantation process and the non-selective epitaxy process is applied, so that the collective process development of the CMOS transistor is easy, and a defect generation region, which may be generated in a border of a region of each device, may be reduced or minimized by decreasing the amount of epitaxy process, thereby being advantageous to decrease a size of the device.

FIGS. 9 to 13 are cross-sectional views illustrating a method of manufacturing the CMOS transistor of FIG. 2.

Figure 9:
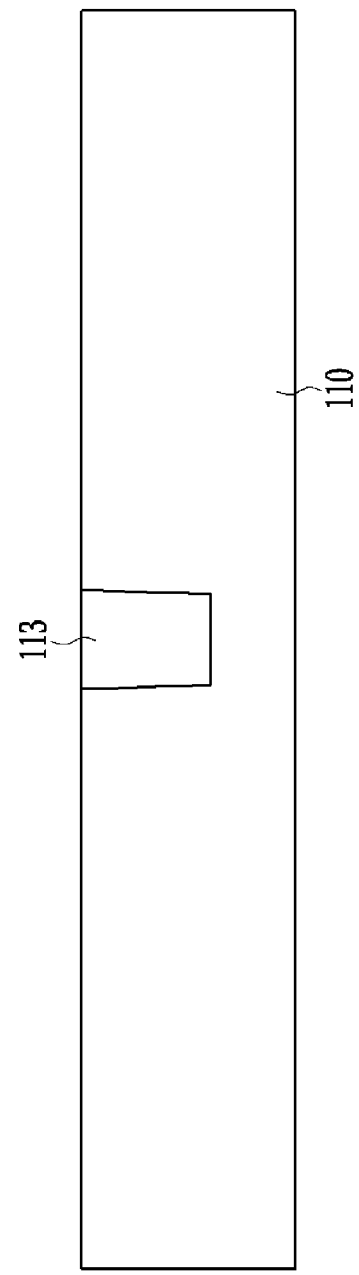
FIGS. 9 to 13 are cross-sectional views illustrating a method of manufacturing the CMOS transistor of FIG. 2.

Referring to FIG. 9, a device isolating region 113 is formed on a substrate 110 by performing a device isolating process. In the present example embodiment, the device isolating region 113 may be formed by a shallow trench isolation (STI) process or a local oxidation of silicon (LOCOS) process.

Figure 10:
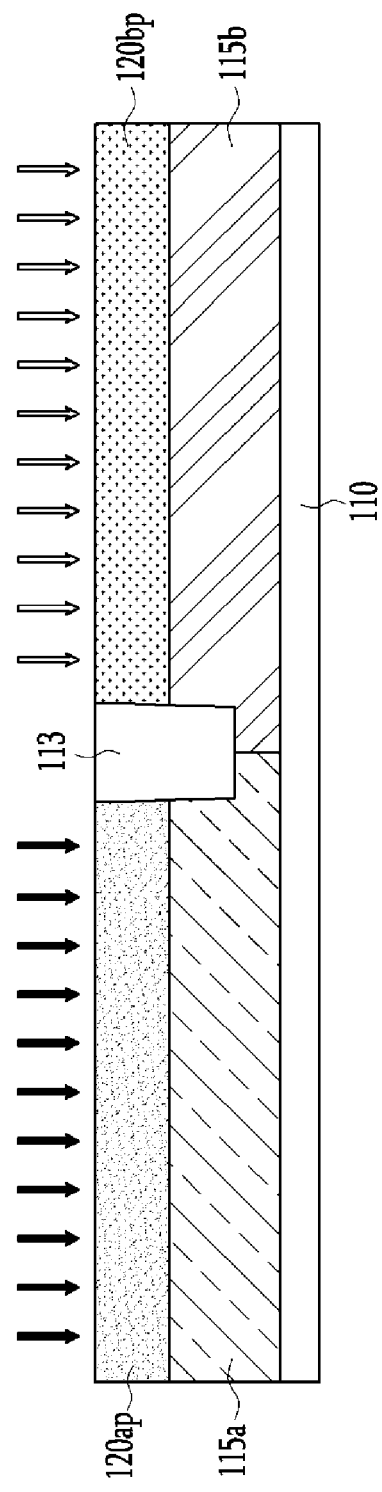

Referring to FIG. 10, a P-well region 115a and an N-well region 115b are formed in the substrate 110, and a first doping layer 120ap and a third doping layer 120bp are formed by implanting ions to the P-well region 115a and the N-well region 115b, respectively. In this case, the first doping layer 120ap may be doped with n-type ions, and phosphorous (P), arsenic (As), and/or antimony (Sb) may be included as an n-type dopant. The third doping layer 120bp may be doped with p-type ions, and boron (B) may be included as a p-type dopant.

Figure 11:
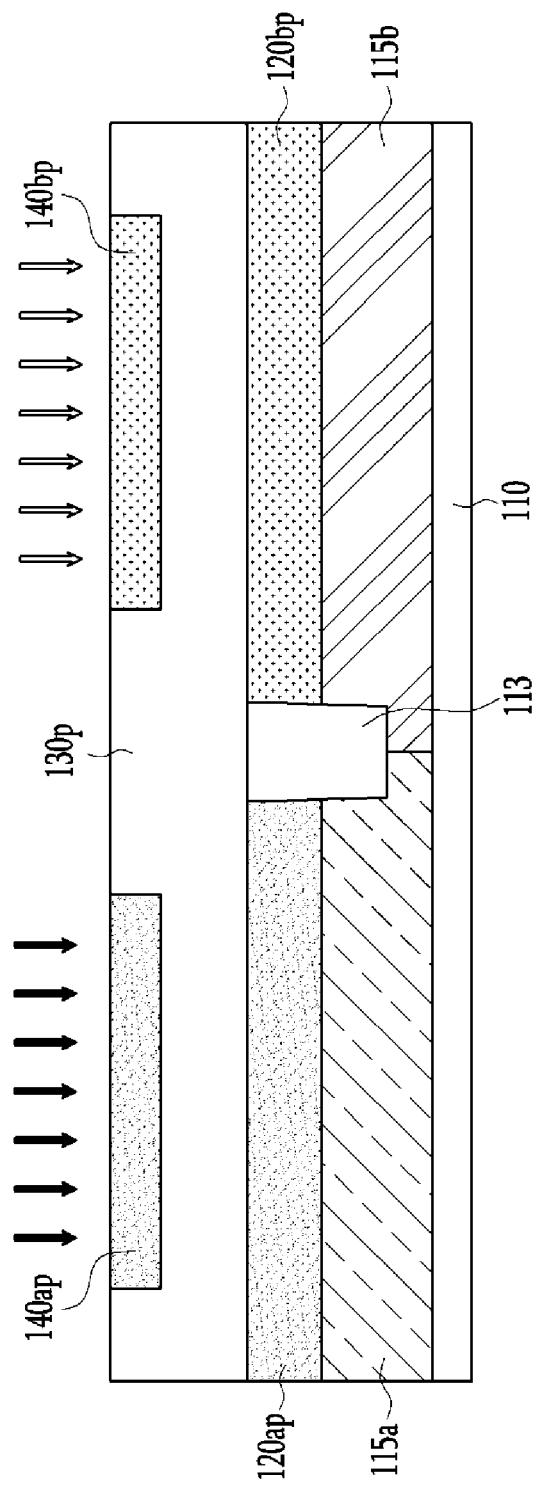

Referring to FIG. 11, a channel layer 130p is formed on the first doping layer 120ap, the device isolating region 113, and the third doping layer 120bp by performing an epitaxy process with the same material as that of the substrate 110. Since the non-selective epitaxy process is applied to the channel layer 130p, the channel layer 130p may be formed on both an n-type region and a p-type region.

Then, a second doping layer 140ap and a fourth doping layer 140bp are formed by implanting ions to an upper surface of the channel layer 130p overlapping the first doping layer 120ap and the third doping layer 120bp, respectively. In this case, a dopant included in the second doping layer 140ap has the same type as that of the first doping layer 120ap, and a dopant included in the fourth doping layer 140bp has the same type as that of the third doping layer 120bp.

Figure 12:
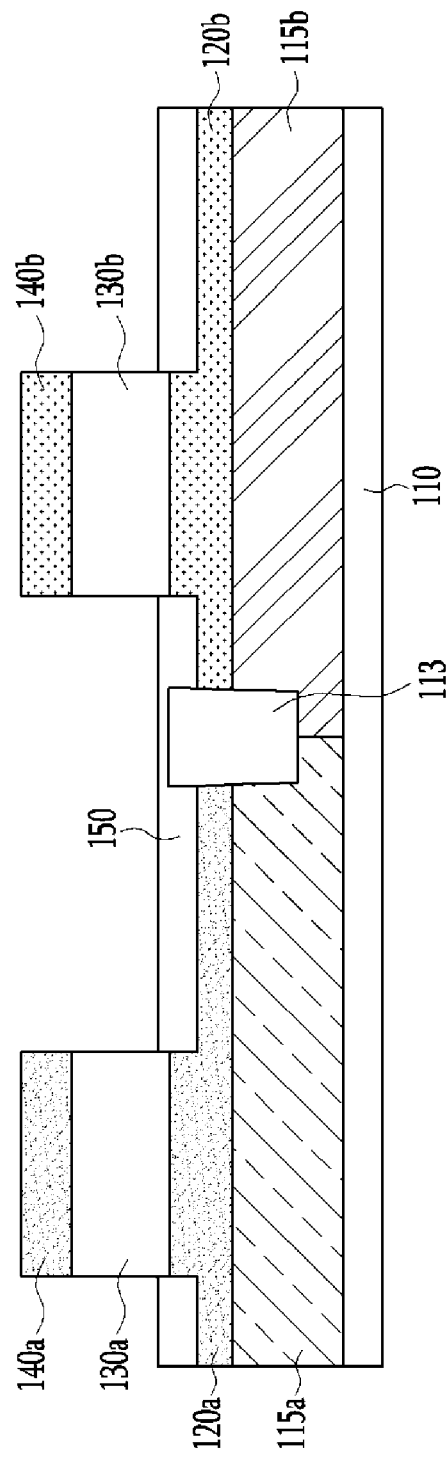

Referring to FIGS. 11 and 12, a first junction region 120a, a first channel region 130a, and a second junction region 140a, which are sequentially positioned on the substrate 110, are formed by etching the first doping layer 120ap, the channel layer 130p, and the second doping layer 140ap, and a third junction region 120b, a second channel region 130b, and a fourth junction region 140b, which are sequentially positioned on the substrate 110, are formed by etching the third doping layer 120bp, the channel layer 130p, and the fourth doping layer 140bp. In this case, a part of the first doping layer 120ap, which does not overlap the first channel region 130a, is etched and a part of the third doping layer 120bp, which does not overlap the second channel region 130b, is etched, so that the first junction region 120a may include a first portion and a second portion, which have different thicknesses, the second portion having a smaller thickness than that of the first portion, and the third junction region 120b may include a third portion and a fourth portion, which have different thicknesses, the fourth portion having a smaller thickness than that of the third portion.

Then, a spacer 150 is formed on the second portions of the first junction region 120a and the third junction region 120b.

Figure 13:
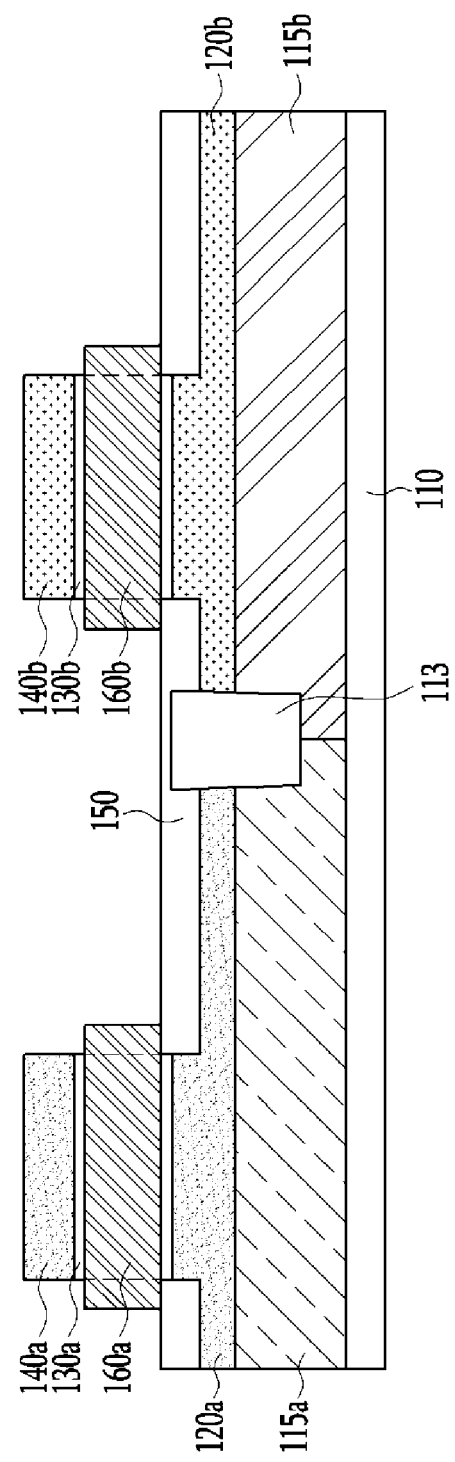

Referring to FIG. 13, a first gate stack 160a is formed so as to at least partially surround the first channel region 130a and a second gate stack 160b is formed so as to at least partially surround the second channel region 130b. Each of the first and second gate stacks 160a and 160b may include a gate dielectric layer and a gate conductor covering the gate dielectric layer.

Then, a first contact plug 170a, a second contact plug 180a, a third contact plug 170b, and a fourth contact plug 180b illustrated in FIG. 2 may be formed by forming a dielectric region having contact holes for contacting the first junction region 120a, a first contact auxiliary layer 145a formed on the second junction region 140a by an epitaxy process, the third junction region 120b, and a second contact auxiliary layer 145b formed on the fourth junction region 140b by an epitaxy process, and then filling the contact holes with a conductive material.

In the present example embodiment, the isolating process for electrically insulating the devices is performed before the epitaxy process, so that it is possible to decrease difficulty in the isolating process and address a limitation of a heat process that may be required when the isolating process is performed after the forming of the channel, thereby obtaining a stable device characteristic and isolation characteristic.

Figure 14:
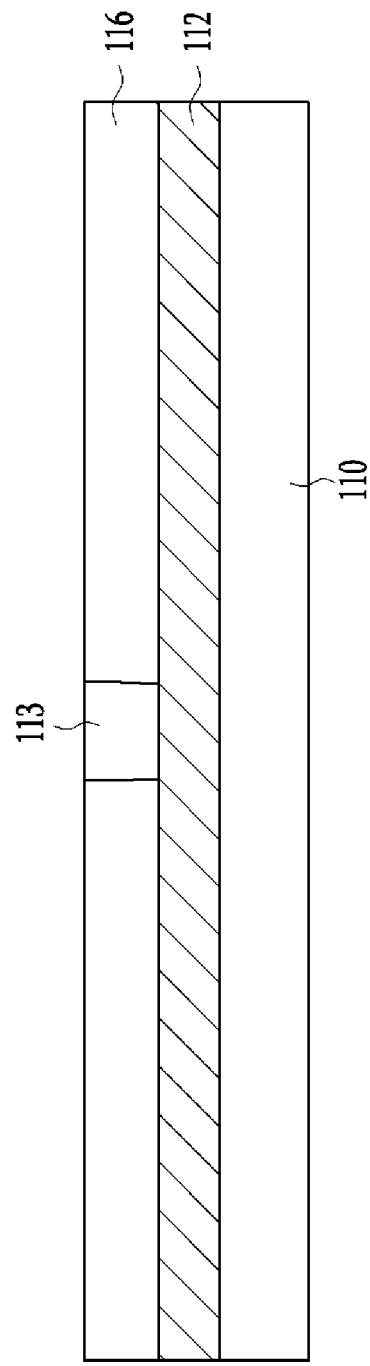
FIGS. 14 and 15 are cross-sectional views illustrating a method of manufacturing the CMOS transistor of FIG. 3.
Figure 15:
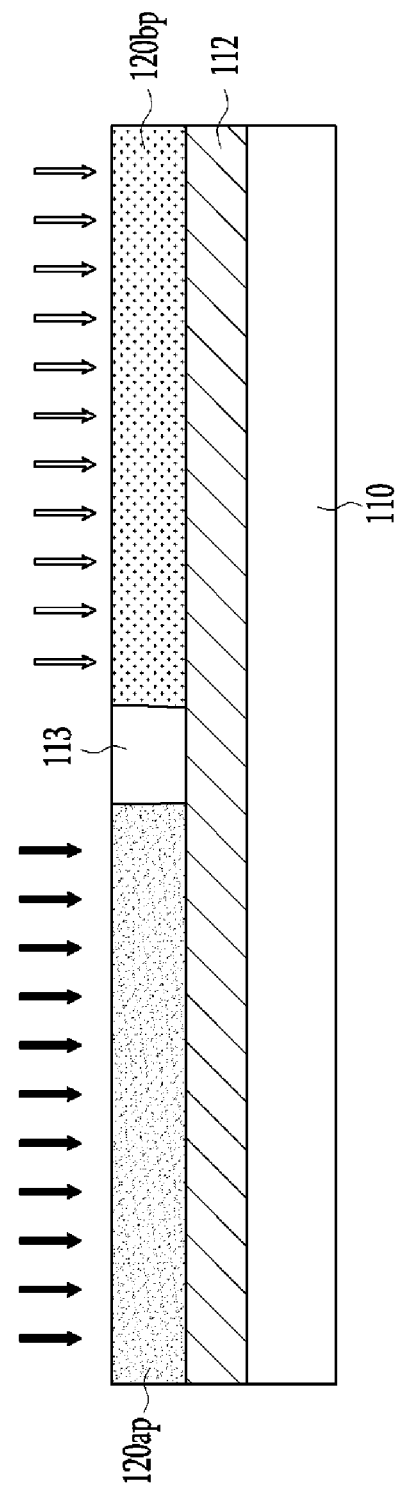

FIGS. 14 and 15 are cross-sectional views illustrating a method of manufacturing the CMOS transistor of FIG. 3.

In the example embodiment of FIGS. 14 and 15, a method of manufacturing the CMOS transistor is mostly the same as the method of manufacturing the CMOS transistor described with reference to FIGS. 9 to 13, and different parts or elements will be described in greater detail below.

Referring to FIG. 14, an oxide layer 112 is formed between a substrate 110 and a silicon single crystal layer 116 in a form of a thin film by applying a silicon on insulator (SOI) process. Then, a device isolating region 113 is formed by performing a device isolating process, and referring to FIG. 15, a first doping layer 120ap and a third doping layer 120bp are formed by implanting ions to the silicon single crystal layer 116.

In the present example embodiment, the operations of forming the P-well region 115a and the N-well region 115b in the method of manufacturing the CMOS transistor described with reference to FIGS. 9 to 13 are not included, and the SOI process is performed instead so that the oxide layer 112 is formed between the substrate 110 and the silicon single crystal layer 116.

Then, when the processes described with reference to FIGS. 11 to 13 are performed in the same way, it is possible to manufacture the CMOS transistor illustrated in FIG. 3.

The terminology used herein is for the purpose of describing particular embodiments only and is not intended to be limiting of example embodiments. It will be understood that when an element is referred to as being "on" or "connected to" or "adjacent" another element (e.g., a layer or substrate), it can be directly on or connected to or adjacent the other element, or intervening elements may also be present. In contrast, when an element is referred to as being "directly on" or "directly connected to" or "immediately adjacent" another element, there are no intervening elements present.

It will also be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will be understood that spatially relative terms, such as "beneath," "below," "lower," "above," "upper" and the like, are intended to encompass different orientations of the device in use or operation in addition to the orientation depicted in the figures. For example, if the device in the figures is turned over, elements described as "below" or "beneath" other elements or features would then be oriented "above" the other elements or features. The device may be otherwise oriented (rotated 90 degrees or at other orientations) and the spatially relative descriptors used herein interpreted accordingly.

The use of the terms "a" and "an" and "the" and similar references herein are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "and/or" includes any and all combinations of one or more of the associated listed items.

While the inventive concepts have been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A method of fabricating a semiconductor device, the method comprising:
   forming a first doping layer by implanting ions into an upper surface of a substrate;
   forming a first channel layer on the first doping layer by an epitaxy method;
   forming a second doping layer by implanting ions into an upper surface of the first channel layer;
   forming a first junction region, a first channel region, and a second junction region, which are sequentially positioned on the substrate, by etching the first doping layer, the first channel layer, and the second doping layer, respectively;
   forming a third junction region, a second channel region, and a fourth junction region, which are sequentially positioned on the substrate, by etching a third doping layer, a second channel layer, and a fourth doping layer, respectively, wherein the etching of the first doping layer comprises forming the first junction region so as to have a first portion and a second portion which has a smaller thickness than that of the first portion, and the etching of the third doping layer comprises forming the third junction region so as to have a third portion and a fourth portion which has a smaller thickness than that of the third portion; and
   forming a first gate stack so as to at least partially surround the first channel region,
   wherein the first doping layer and the second doping layer have a same conductivity type.

2. The method of claim 1, further comprising:
   forming a spacer positioned on the second portion of the first junction region and the fourth portion of the third junction region between the etching of the first doping layer and the forming of the first gate stack.

3. The method of claim 2, wherein:
   a height of the spacer is smaller than a height of the first channel region or the second channel region.

4. The method of claim 1, further comprising:
   forming a first contact auxiliary layer on the second junction region by using an epitaxy process; and
   forming a second contact auxiliary layer on the fourth junction region by using the epitaxy process,
   wherein the first contact auxiliary layer is formed to have a larger width than a width of the second junction region, and the second contact auxiliary layer is formed to have a larger width than a width of the fourth junction region.

5. The method of claim 1, further comprising:
   performing an annealing process comprising at least one of an operation between the forming of the first doping layer and the etching of the first doping layer, or an operation between the forming of the second doping layer and the etching of the second doping layer.

6. A method of fabricating a semiconductor device, the method comprising:
   performing a device isolating process on a substrate;
   forming a first doping layer in an n-type region and forming a third doping layer in a p-type region by implanting ions into respective portions of an upper surface of the substrate;
   forming a first channel layer on the first doping layer in the n-type region and forming a second channel layer on the third doping layer in the p-type region by an epitaxy method;
   forming a second doping layer on the first channel layer in the n-type region and forming a fourth doping layer on the second channel layer in the p-type region by implanting ions into respective upper surfaces thereof;
   forming a first junction region, a first channel region, and a second junction region, which are sequentially positioned on the n-type region, by etching the first doping layer, the first channel layer, and the second doping layer, respectively;
   forming a third junction region, a second channel region, and a fourth junction region, which are sequentially positioned on the p-type region, by etching the third doping layer, the second channel layer, and the fourth doping layer, respectively, in the etching of the first doping layer, the first channel layer, and the second doping layer;
   forming a first gate stack so as to at least partially surround the first channel region; and
   forming a second gate stack so as to at least partially surround the second channel region,
   wherein the first doping layer and the second doping layer have a same conductivity type, and wherein the first channel layer and the second channel layer are simultaneously formed.

7. The method of claim 6, wherein the epitaxy method is non-selective with respect to the first doping layer in the n-type region and the third doping layer in the p-type region.

8. A method of fabricating a semiconductor device, the method comprising:
forming an n-type transistor on a substrate, the n-type transistor comprising a first junction region, a first channel region on the first junction region, and a second junction region on the first channel region; and
forming a p-type transistor on the substrate adjacent the n-type transistor, the p-type transistor comprising a third junction region, a second channel region on the third junction region, and a fourth junction region on the second channel region,
wherein the first junction region has a first portion and a second portion which has a smaller thickness than that of the first portion, and the third junction region has a third portion and a fourth portion which has a smaller thickness than that of the third portion, and
wherein forming the n-type transistor and forming the p-type transistor comprises:
forming an epitaxial channel layer on the substrate and etching the epitaxial channel layer to simultaneously define the first channel region of the n-type transistor and the second channel region of the p-type transistor.

9. The method of claim 8, wherein forming the n-type transistor and forming the p-type transistor further comprises:
forming a first doped layer and a third doped layer on the substrate by implanting ions into the substrate;
forming the epitaxial channel layer on the first and third doped layers by a non-selective epitaxy process;
forming a second doped layer and a fourth doped layer by implanting ions into surfaces of the epitaxial channel layer opposite the first doped layer and the third doped layer, respectively, wherein the first and second doped layers are n-type, and wherein the third and fourth doped layers are p-type;
sequentially etching the second and fourth doped layers, the epitaxial channel layer, and the first and third doped layers to define the second and fourth junction regions, the first and second channel regions, and the first and third junction regions; and
forming a first gate stack so as to at least partially surround the first channel region and a second gate stack so as to at least partially surround the second channel region.

10. The method of claim 8, wherein the first portion is beneath the first channel region and the second portion laterally extends along the substrate beyond the first channel region, and wherein the third portion is beneath the second channel region and the fourth portion laterally extends along the substrate beyond the second channel region.

11. The method of claim 8, further comprising:
forming a spacer on the second portion of the first junction region and the fourth portion of the third junction region.

12. The method of claim 8, further comprising:
forming a first contact auxiliary layer on the second junction region and a second contact auxiliary layer on the fourth junction region,
wherein the first contact auxiliary layer has a larger width than that of the second junction region, and the second contact auxiliary layer has a larger width than that of the fourth junction region.

13. The method of claim 8, wherein the first channel region and the second channel region comprise dopants of a same conductivity type as that of the first junction region and the third junction region, respectively.

14. The method of claim 8, wherein each of the first junction region and the second junction region comprises at least one of arsenic (As) or antimony (Sb).

* * * * *